CONTACT FOR DIRECT RECEPTION OF PRINTED CIRCUIT BOARD

Original Filed March 20, 1961 3 Sheets-Sheet 1

*INVENTOR.*
HERBERT E. RUEHLEMANN
*BY*
Caesar and Rivise
ATTORNEYS.

CONTACT FOR DIRECT RECEPTION OF PRINTED CIRCUIT BOARD

Original Filed March 20, 1961 3 Sheets-Sheet 2

INVENTOR.
HERBERT E. RUEHLEMANN
BY
Caesar and Rivise
ATTORNEYS.

CONTACT FOR DIRECT RECEPTION OF PRINTED CIRCUIT BOARD

Original Filed March 20, 1961 3 Sheets-Sheet 3

INVENTOR.
HERBERT E. RUEHLEMANN

BY

Caesar and Rivise

ATTORNEYS.

United States Patent Office

Re. 26,692
Reissued Oct. 14, 1969

26,692
CONTACT FOR DIRECT RECEPTION OF PRINTED CIRCUIT BOARD

Herbert E. Ruehlemann, Montgomery County, Pa., assignor to Elco Corporation, Philadelphia, Pa., a corporation of Pennsylvania Original No. 3,231,848, dated Jan. 25, 1966, Ser. No. 96,819, Mar. 20, 1961. Application for reissue Sept. 7, 1967, Ser. No. 669,984
Int. Cl. H01r *13/24, 13/50;* H05k *1/00*
U.S. Cl. 339—176 4 Claims

Matter enclosed in heavy brackets [ ] appears in the original patent but forms no part of this reissue specification; matter printed in italics indicates the additions made by reissue.

*ABSTRACT OF THE DISCLOSURE*

*Species of printed-circuit card-edge wire-wrap contacts include a double cantilever nose section comprised of a pivot arm connected at one end to a support leg and at the other end to a wiping finger having a wiping surface. The connection between the pivot arm and support leg constitutes a first pivot section comprised of lengths of said pivot arm and support leg lying substantially in a single plane, and the connection between the pivot arm and wiping finger constitutes a second pivot section with the angle between the wiping surface of the wiping finger and the plane of the pivot arm being formed by a bend of either 90 degrees or 180 degrees.*

This invention relates to a contact which may be affixed in an insulating casing to form a connector member to make direct contact with printed circuit conductive strips.

Contacts of this nature have been used heretofore and are known as "bellows type" contacts because compression thereof proceeds about at least two pivot points to simulate the action of a bellows. The bellows structure enables the contact to firmly grip the printed circuit even when the assembly is subjected to vibrations or wear. Another advantage of the bellows type contact is that the pressure exerted by the contact on the printed circuit is fairly constant even though the thickness of the particular printed circuit being employed may vary somewhat from others previously inserted.

Prior bellows type contacts have been so constructed as to have the metal strip bent almost a full 180° at each pivot point. Such severe bending is practical only when the metal strip is relatively thin, namely, of the order of .008 inch thick. Unfortunately, however, the tail portion of the contact will be of the same thickness which is much too weak to accept the automatic wrapping accomplished by automatic machines. Such an automatic wrapping machine is a Keller Wire Wrap machine which automatically secures the lead from an outside circuit to the tail of a contact. When the contact tail is of thin material, it deflects too easily when being automatically wrapped and thus the accuracy of the tail type location is destroyed. Attempts have been made to overcome this problem by doubling the material at the tail and by contouring the tail in the longitudinal direction to a V shape, but this entails even more bending and shaping. Should a much thicker material be used in forming the contact, the thickness of the material will make the bending operations at the head of the contact extremely difficult if not impracticable.

It is accordingly an object of the present invention to form a bellows type contact from a relatively thick strip of material.

A further object of this invention is to form a bellows type contact wherein at least one of the two or more pivot points constituting the bellows is formed purely by a stamping operation and there is no bending whatsoever in the formation of the particular pivot point.

Yet another object of this invention is to provide a bellows type contact wherein at least one of the pivot points lies in the same plane as the contact elements about which the pivoting action occurs.

The foregoing, as well as other objects of this invention, are achieved by providing a bellows type contact which comprises basically a head section and a tail section, the head section including a support leg and a pivot arm which generally are in the same plane and which were formed by a simple stamping operation. The pivot arm terminates in a wiping finger which makes the actual contact with the printed circuit conductive strip. The wiping finger was simultaneously stamped from the metal stock with the stamping of the pivot arm and the support leg. However, in several embodiments of the invention, the wiping finger is bent either at right angles or for a full 180° with respect to the pivot arm and support leg.

Other objects and many of the attendant advantages of this invention will be readily appreciated as the same becomes better understood by reference to the following detailed description when considered in connection with the accompanying drawings whrein:

Figure 1:
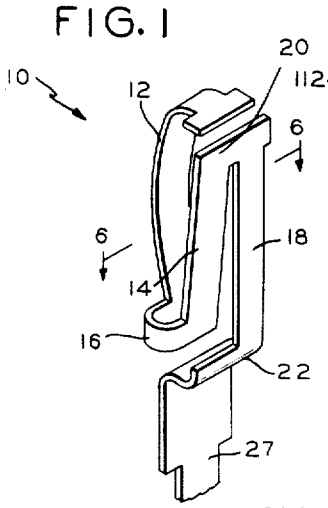
FIG. 1 is a perspective view of a contact constituting a first embodiment of the present invention.

Referring now in greater detail to the various figures of the drawings wherein similar reference characters refer to similar parts. A contact for direct reception of printed circuit board constructed of highly conductive material constituting a first embodiment of the present invention is generally shown at 10 in FIG. 1 and comprises basically a wiping finger 12 connected to a pivot arm 14 by means of a 180° bend 16 with the pivot 14 merging at its upper end with supporting leg 18 lying in the same plane at the junction point. It is to be noted that the 180° bend 16 constitutes a first pivot point and the second pivot point 20 is to be found at the merger of pivot arm 14 and support 18.

Figure 2:
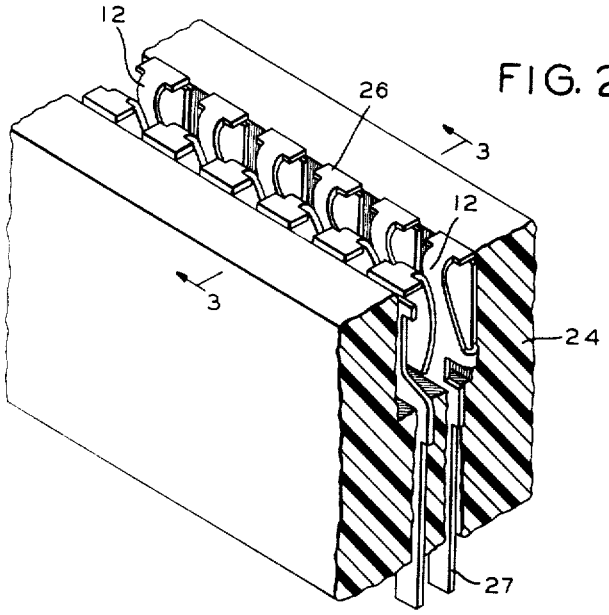
FIG. 2 is a perspective view of a plurality of contacts of FIG. 1 mounted in spaced opposing relationship in an insulating casing.
Figure 6:
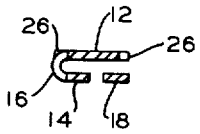
FIG. 6 is a sectional view taken along the lines 6—6 of FIG. 1.
Figure 3:
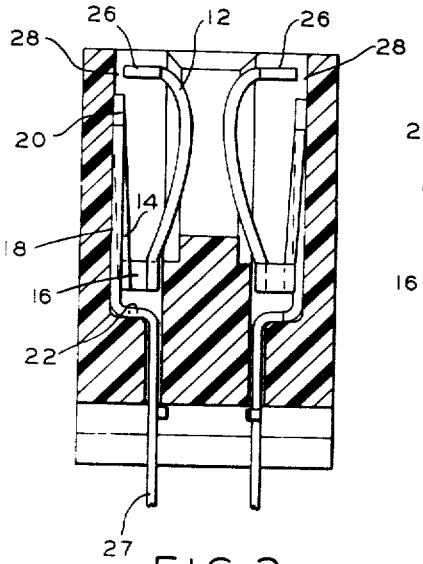
FIG. 3 is a sectional view taken along the lines 3—3 of FIG. 2.
Figure 4:
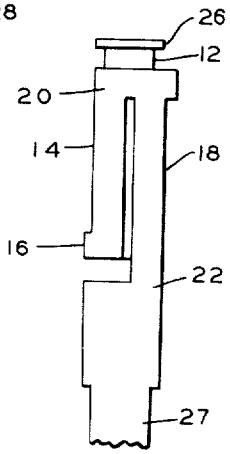
FIG. 4 is a side elevational view of the contact of FIG. 1 taken from the side away from the wiping finger.
Figure 5:
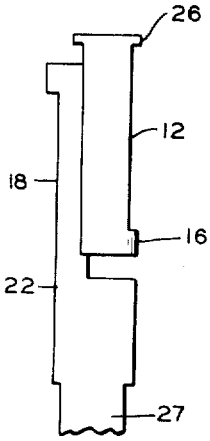
FIG. 5 is a view similar to FIG. 4 but taken from the side closest to the wiping finger.

The wiping finger 12 as shown in FIG. 2 will make mechanical and electrical contact with the conductive members of a printed circuit board inserted thereagainst. The wiping finger 12 is bent in a convex manner so as to approach a complementary wiping finger as shown in FIG. 2 of the drawing, thereby enhancing the resiliency of the contacts. A horizontally extending shoulder 22 is optionally provided at the lower foot of the support leg to enhance seating of the contact in insulating casing 24. The contact 10 further includes a tail 27 to which an external circuit may be secured. This tail is of a thickness to withstand the forces created by the automatic wrapping machines. As shown in FIGS. 1 and 3, the pivot arm 14 is displaced slightly forward of the support leg 18 to further enhance the resiliency of contact 10. It is to be noted that the upper end of wiping finger 12 terminates in a lateral tab 26 which will abut against inner walls 28 of casing 24 to limit the expansibility of a wiping finger as urged by an inserted printed circuit. It is to be noted that the shoulder 22 functions to seat the contact in the insulating casing and may be dispensed with if so desired.

As shown in FIGS. 2 and 3, a pair of contacts 10 may be spaced across from each other to receive a printed circuit member having conductors on both sides thereof. It is thus seen that a bellows type contact is provided wherein one of the two pivot points is formed merely by stamping and need not be bent in order to perform its function. Hence, a great labor saving is effected and, at the same time, a tail of adequate strength is provided.

Figure 7:
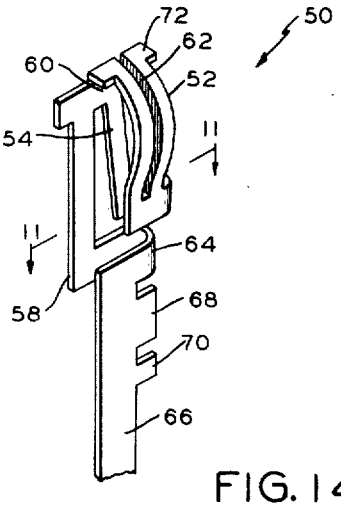
FIG. 7 is a perspective view of a second embodiment of the present invention.
Figure 8:
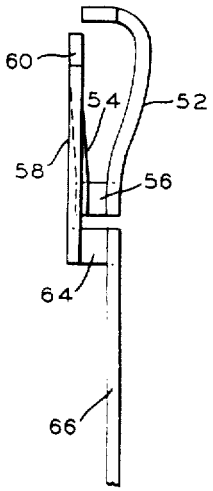
FIG. 8 is a side elevational view of the device of FIG. 7.
Figure 9:
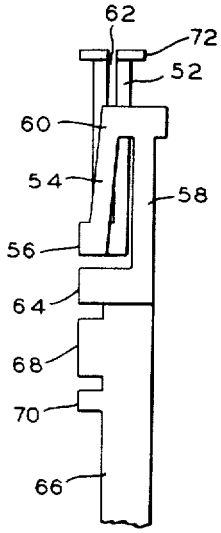
FIG. 9 is an elevational view of the device of FIG. 7 taken from the side away from the wiping finger.
Figure 10:
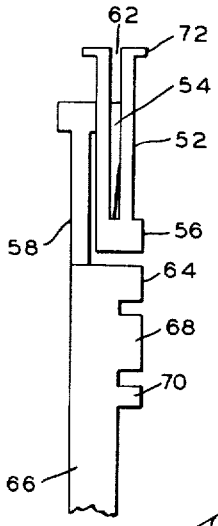
FIG. 10 is a view similar to FIG. 9 but is taken from the side toward the wiping finger.
Figure 11:
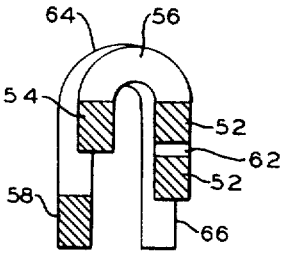
FIG. 11 is a view taken along the lines 11—11 of FIG. 7.

The contact shown in FIGS. 7 to 11 constitutes a second embodiment of the present invention. As shown in FIG. 7, contact 50 is generally similar to contact 10 of FIGS. 1 to 6 and includes a wiping finger 52, a pivot arm 54 secured to the wiping finger 52 by a 180° bend 56. The pivot arm 54 merges into support leg 58 to establish a second pivot point 60. It is to be noted that the wiping finger 52 is centrally slit at 62 to enhance the resiliency of the contact. It is further to be noted that the pivot arm 54 as indicated in FIG. 8 extends slightly forwardly of support leg 58. Likewise, the 180° bend 56 is positioned forwardly of the support leg 58.

Referring again to FIG. 7, the support leg 58 terminates in a shoulder 64 which extends in a vertical direction instead of horizontally as is the shoulder 22. Fingers 68 and 70 project from contact tail 66 to aid in its securement to an insulating casing. It is to be further noted that upper edges of the wiping fingers 52 terminate in lateral tabs 72 similar to tabs 26.

Figure 12:
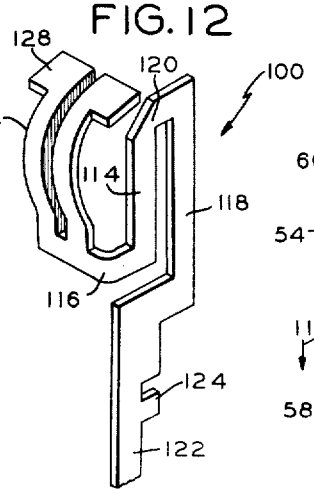
FIG. 12 is a perspective view of a contact constituting a third embodiment of the present invention.

A third embodiment of the present invention is shown in FIGS. 12 to 18. This embodiment differs from the first two forms basically in the fact that the wiping finger lies at right angles to the pivot arm. As shown in FIG. 12, the contact 100 basically comprises a wiping finger 112 merging into a pivot arm 114 at right angle bend 116. The pivot arm merges at its upper end with support leg 118 which lies in the same plane as the pivot arm. Thus, pivoting occurs about right angle bend 116 and also at point 120 which marks the merger of pivot arm 114 and support leg 118. As shown in FIG. 12, a shoulder portion below the support leg is absent but may be provided if desired. Hence, the contact 100 lacks a shoulder such as shoulder 22 of FIG. 1 or shoulder 64 of FIG. 7. The contact 100 terminates in a tail 122 including affixing finger 124. It is to be noted that the wiping finger 112 includes a central slit and is shaped convexly in an outward direction to enhance resiliency. Tabs 128 are provided on the contact and function similar to tabs 26 and tabs 72 of FIGS. 1 and 7 respectively.

Figure 14:
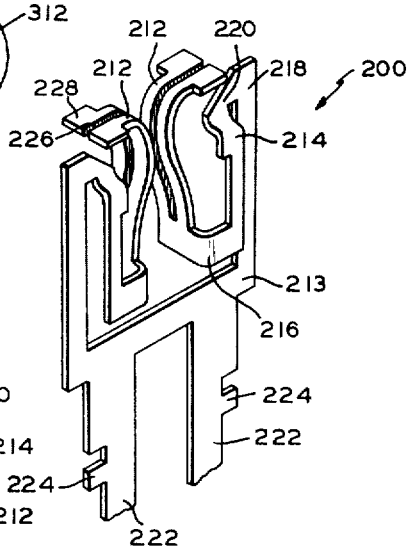
FIG. 14 is a view similar to FIG. 12 but showing two contact heads similar to the contact head of FIG. 12 mounted on a common base from which two contact tails extend whereby the contact heads are located in the same electrical circuit.
Figure 13:
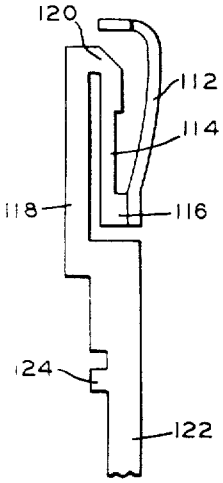
FIG. 13 is a sectional view taken through the contact of FIG. 12.

The contact 200 of FIG. 14 is generally similar to that of FIG. 12 but comprises a pair of opposed wiping fingers 212 which eventually merge into a common base 213 from which tails extend. Hence, it follows that the wiping fingers 212 are in the same electrical circuit whereas a pair of opposed wiping fingers 12 of FIG. 2 were electrically insulated from each other. The configuration of FIG. 14 is made possible because the wiping fingers lie at right angles to the pivot arm 214 and thus can oppose each other.

As shown in FIG. 14, the pivot arm 214 is displaced slightly outwardly from the support leg 218. This is optional and can be dispensed with depending upon the particular need.

Figure 15:
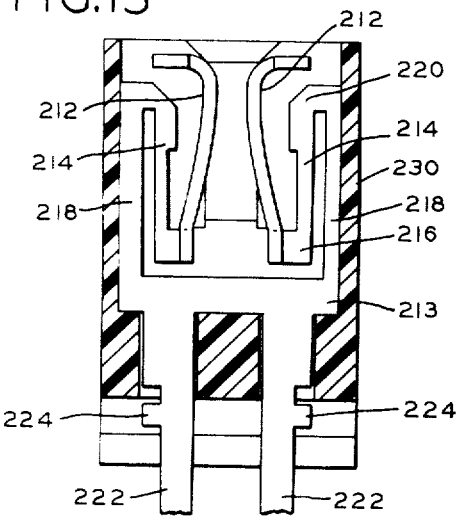
FIG. 15 is a sectional view of the device of FIG. 14 mounted in an insulating casing.
Figure 16:
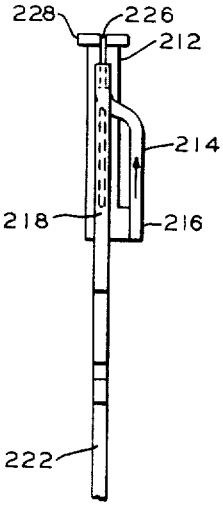
FIG. 16 is a side elevational view of the contact of FIG. 14.
Figure 17:
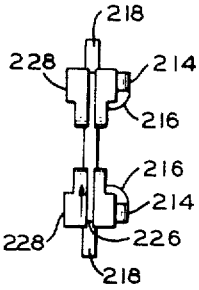
FIG. 17 is a top plan view of the contact of FIG. 14.

Contact 200 further comprises right angle bend 216 and there is also present second pivot point 220 at the juncture of pivot arm 214 and support leg 218. A pair of tails 222 extend from the common base 213 and include affixing fingers 224. The wiping arms 212 further include a central slit 226 and tabs 228. It is further to be observed from FIG. 14 that the displacement of pivot arm 214 in an outward direction is optional and can be dispensed with as indicated in FIG. 15. FIG. 16 generally shows the contact of FIG. 14 in side elevation.

Figure 18:
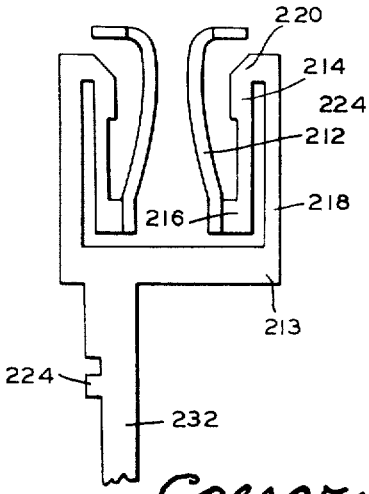
FIG. 18 is a front elevational view of a contact similar to that of FIG. 14 but wherein one contact tail has been eliminated.

The contact of FIG. 18 is generally similar to the contact of FIG. 14; however, one of the pairs of the contact tails 222 has been eliminated and thus there remains a single contact tail 232. From an electrical standpoint, the contact of FIG. 18 is identical to the contact of FIG. 14.

Figure 19:
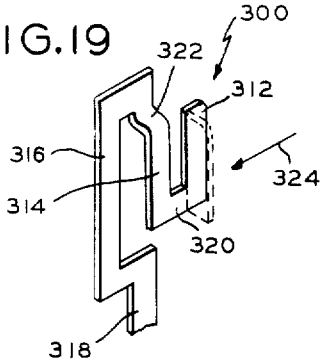
FIG. 19 is a perspective view of a contact constituting a fourth embodiment of the present invention.
Figure 21:
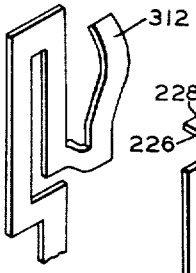
FIG. 21 is a view similar to FIG. 19 but wherein the wiping finger has been contoured and offset from the pivot arm.
Figure 20:
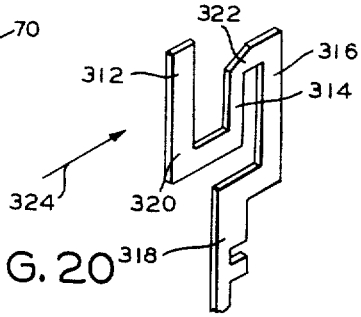
FIG. 20 is a perspective view similar to FIG. 19 but wherein the entire contact lies in a single plane.

The contacts of FIGS. 19 to 21 differ from all contacts previously discussed in that both pivot points may lie in the same plane as the wiping finger, pivot arm and support leg. Hence, in the contact of FIG. 19, the contact 300 generally comprises a wiping finger 312, a pivot arm 314, a support leg 316 and a tail 318. The juncture 320 between wiping finger 312 and pivot arm 314 is in the same plane as the finger and the arm. Similarly, the second pivot point 322 at the juncture of pivot arm 314 and support leg 316 may lie in the same plane as the arm and the leg as indicated in FIG. 20 or it may be alternatively displaced as shown in FIG. 19. Also, the wiping finger 312 may be bent at right angles as in phantom in FIG. 19 to enhance resiliency in a manner similar to FIG. 12. Optionally, the wiping arm 312 may be bent into a convex configuration as shown in FIG. 21. Pressure from the inserted printed circuit and against the wiping finger is in the direction of arrow 324 of FIGS. 19 and 20.

It is therefore seen that the contact of the present invention exerts a bellows type action on the conductive strip of an inserted printed circuit. However, at least one of the two pivot points for the bellows action is formed solely by a stamping action. In other words, the pivot arms lie substantially in a single plane.

Obviously many modifications and variations of the present invention are possible in the light of the above teachings. It is, therefore, to be understood that within the scope of the appended claims, the invention may be practiced otherwise than as specifically described.

What is claimed as the invention is:

1. A contact for direct reception of a printed circuit board having printed means thereon, said contact being stamped from a relatively rigid flat conductive strip, said contact comprising a head section and a tail section, said head section including at least one pivot arm having a supporting leg extending from one end thereof and a resilient wiping finger extending from the other end thereof, the juncture of said supporting leg and pivot arm constituting a first pivot section comprised of lengths of said supporting leg and pivot arm lying substantially in a first plane and the juncture of said pivot arm and resilient wiping finger constituting a second pivot section comprised of [a] substantially [180 degree] *at least a 90 degree* bend, [said supporting leg lying in said first plane with a substantial length of said pivot arm being inclined away from said first plane and displaced toward said wiping finger in extending from said first pivot section to said second pivot section, said wiping arm being bowed out away from said pivot arm,] said wiping arm making electrical and resilient mechanical contact with at least one printed means of said printed circuit board, said resilient mechanical contact occurring with flexing of said wiping finger about said second pivot section and displacement of said pivot arm about said first pivot section.

2. The invention of claim 1 wherein said tail section is formed from said strip with said tail section having the same thickness as said strip, said tail section thereby being automatically sufficiently rigid to withstand wrapping pressures of automatic wire wrapping machines.

3. The invention of claim 1 wherein a plurality of said contact elements are affixed to an insulating casing whereby the wiping fingers of the contacts are disposed in opposed parallel rows.

*4. The invention of claim 1 wherein said wiping arm has a wiping surface for making electrical and resilient mechanical contact with at least one printed means of said printed circuit board, said wiping surface being perpendicular to said first plane.*

References Cited

The following references, cited by the Examiner, are of record in the patented file of this patent or the original patent.

UNITED STATES PATENTS

| | | | |
|---|---|---|---|
| 911,032 | 2/1909 | Dow | 339—257 |
| 1,142,479 | 6/1915 | Beck | 339—257 |
| 1,602,370 | 10/1926 | Avery | 339—33 |
| 1,875,179 | 8/1932 | Prouty | 339—57 |
| 2,154,302 | 4/1939 | Clement | 339—258 |
| 2,575,161 | 11/1951 | Deakin | 339—258 |
| 2,648,356 | 8/1953 | Beaulieu et al. | 339—276 |
| 2,713,673 | 7/1955 | Batcheller | 339—258 |
| 2,832,013 | 4/1958 | Pederson et al. | 339—17 |
| 2,875,425 | 2/1959 | Gilbert | 339—176 |
| 2,911,612 | 11/1959 | Jackson et al. | 339—17 X |
| 2,935,725 | 5/1960 | Fox | 339—17 X |
| 2,937,357 | 5/1960 | Kennedy | 339—17 |
| 3,007,132 | 10/1961 | Anderson | 339—258 X |
| 3,047,831 | 7/1962 | Majewski | 339—258 X |
| 3,087,136 | 4/1963 | Peterson et al. | 339—276 X |
| 3,133,780 | 5/1964 | Dean | 339—258 |

FOREIGN PATENTS

| | | |
|---|---|---|
| 496,868 | 12/1938 | Great Britain. |
| 611,497 | 10/1948 | Great Britain. |
| 730,762 | 5/1955 | Great Britain. |
| 580,734 | 8/1958 | Italy. |

RICHARD E. MOORE, Primary Examiner